United States Patent
Bagger

(10) Patent No.: US 10,250,237 B2
(45) Date of Patent: Apr. 2, 2019

(54) ELECTRONIC LATCH CIRCUIT AND A GENERIC MULTI-PHASE SIGNAL GENERATOR

(71) Applicant: Telefonaktiebolaget LM Ericsson (publ), Stockholm (SE)

(72) Inventor: Reza Bagger, Järfälla (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 29 days.

(21) Appl. No.: 15/517,574

(22) PCT Filed: May 4, 2015

(86) PCT No.: PCT/SE2015/050489
§ 371 (c)(1),
(2) Date: Apr. 7, 2017

(87) PCT Pub. No.: WO2016/089275
PCT Pub. Date: Jun. 9, 2016

(65) Prior Publication Data
US 2017/0244393 A1    Aug. 24, 2017

(30) Foreign Application Priority Data

Dec. 2, 2014  (WO) .................. PCT/SE2014/051430

(51) Int. Cl.
*H03K 3/356*  (2006.01)
*H03K 3/3562*  (2006.01)
(Continued)

(52) U.S. Cl.
CPC ....... *H03K 3/356104* (2013.01); *H03K 3/356* (2013.01); *H03K 3/35625* (2013.01);
(Continued)

(58) Field of Classification Search
CPC .................................................. H03K 3/356
See application file for complete search history.

(56) References Cited

U.S. PATENT DOCUMENTS 6,163,182 A    12/2000  Canard et al.
7,521,976 B1    4/2009  Sudjian et al.
(Continued)

FOREIGN PATENT DOCUMENTS

JP    2013106268 A    5/2013
WO    2007004181 A2   1/2007
(Continued)

OTHER PUBLICATIONS

Fabiano, I, et al., "SAW-Less Analog Front-End Receivers for TDD and FDD," IEEE Journal of Solid State Circuits, vol. 48, Issue 12, Special Issue on the 2013 IEEE International Solid-State Circuits Conference, Session 5, RF Techniques, 5.1, pp. 1-3.
(Continued)

*Primary Examiner* — Hai L Nguyen
(74) *Attorney, Agent, or Firm* — Coats & Bennett, PLLC

(57) ABSTRACT

An electronic latch circuit (100) and a multi-phase signal generator (300) are disclosed. The electronic latch circuit (100) comprises an output circuit (105) comprising a first output (X, 106), a second output (Y, 107) and a third output (Z, 108). The electronic latch circuit (100) further comprises an input circuit (101) comprising a first input (A, 102), a second input (B, 103) and a clock signal input (CLK, 104). The electronic latch circuit (100) is configured to change state based on input signals at the inputs (A, B, CLK) of the input circuit (101) and a present state of the output circuit (105). The multi-phase signal generator (300) comprises a plurality N of the electronic latch circuit (100) for generating N phase signals with individual phases. The plurality N of the electronic latch circuit (100) are cascaded with each other.

7 Claims, 10 Drawing Sheets

(51) Int. Cl.
*H03K 21/10* (2006.01)
*H03K 23/42* (2006.01)
*H03K 19/20* (2006.01)
*H04B 1/40* (2015.01)
*H03K 5/15* (2006.01)
*H03K 3/37* (2006.01)
*H03K 23/48* (2006.01)

(52) U.S. Cl.
CPC ......... *H03K 3/356139* (2013.01); *H03K 3/37* (2013.01); *H03K 5/15066* (2013.01); *H03K 19/20* (2013.01); *H03K 21/10* (2013.01); *H03K 23/425* (2013.01); *H04B 1/40* (2013.01); *H03K 23/483* (2013.01)

(56) References Cited

U.S. PATENT DOCUMENTS

| | | | | |
|---|---|---|---|---|
| 8,314,639 | B2 * | 11/2012 | Tsai | ............ G06F 1/08 327/115 |
| 8,487,682 | B2 * | 7/2013 | Du | ............ H03K 5/15093 327/231 |
| 2004/0012416 | A1 | 1/2004 | Cheung et al. | |
| 2009/0068975 | A1 | 3/2009 | Luong et al. | |
| 2011/0234266 | A1 | 9/2011 | Tsai | |

FOREIGN PATENT DOCUMENTS

| | | |
|---|---|---|
| WO | 2011003101 A1 | 1/2011 |
| WO | 2013073268 A1 | 5/2013 |
| WO | 2016089260 A1 | 6/2016 |

OTHER PUBLICATIONS

Nejdel, A., et al., "A 0.7-3.7 GHz Six Phase Receiver Front-End With Third Order Harmonic Rejection," 2013 Proceedings of the 39th European Solid-State Circuits Conference, Sep. 16, 2013, Bucharest, Romania, pp. 279-282.

Magoon, R., et at. "RF Local Oscillator Path for GSM Direct Conversion Transceiver With True 50% Duty Cycle Divide by Three and Active Third Harmonic Cancellation," IEEE Radio Frequency Integrated Circuits Symposium, Jun. 17, 2002, Montreal, Canada, pp. 23-26.

Zhou, C., et al., "A 50% duty cycle wide-locking range divide-by-3 divider up to 6 GHz," 2011 IEEE Radio Frequency Integrated Circuits Symposium (RFIC), Jul. 5, 2011, Baltimore, Maryland, pp. 1-4.

* cited by examiner

ELECTRONIC LATCH CIRCUIT AND A GENERIC MULTI-PHASE SIGNAL GENERATOR

TECHNICAL FIELD

Embodiments herein relate to an electronic latch circuit and multi-phase signal generators using the electronic latch circuit. In particular, they relate to multi-phase signal generators comprising a plurality of the electronic latch circuits for generating multi-phase signals for multi-phase harmonic rejection mixers, HRM in transceivers and/or for electronic devices.

BACKGROUND

Nowadays, multi-standard broad band transceiver, is an emerging topology in cellular telecommunication systems. Moreover, high performance is required with several difficult standards among the targeted applications. The issue is further complicated by requirements on more compact form factor and on design approaches toward more integration. Moreover, Complementary Metal Oxide Semiconductor (CMOS) low quality factor (low-Q) components are limiting the performance of many circuit techniques. Consequently new architectures and circuit techniques must be explored.

To address some of the mentioned issues, In-phase and Quadrature-phase (I/Q) modulator and Harmonic Rejection Mixers (HRM) have recently gained attention. Indeed the vast majority of transceivers fall into I/Q modulator based receivers and transmitters. These modulators use In-phase and Quadrature-phase mixers (I/Q mixers). I/Q mixers address the problem of maximizing information transmission in a limited bandwidth by allowing the user to modulate both the in-phase and quadrature phase components of a carrier simultaneously, doubling the information density.

In order to drive an I/Q mixer, in one approach, a divider able to create 25% duty cycle signals from an externally supplied clock at 2*fLO is often used, where fLO is the frequency of local oscillator (LO) signal input to the mixer. Such a divider is disclosed in a conference paper by Ivan Fabiano et al., "*SAW-less analog front-end receivers for TDD and FDD*", ISSC2013, p 82-p 85. The divider according to Fabiano utilizes a latch disclosed in the same paper.

A divider which generates 25% duty cycle signals is in the art often called a 4-phase signal generator.

The divider and latch disclosed by Fabiano are derived from a circuit disclosed in an article by Behzad Razavi et al., "*Design of high-speed, low-power frequency dividers and phase-locked loops in deep submicron CMOS*", IEEE journal of solid-state circuits, vol. 30, No. 2, February 1995. In the article several novel circuits are disclosed.

In general, there are potential timing problems associated with the latch circuit disclosed by Razavi. Even though the circuit operates properly in a specific scope of application, the circuit poses timing uncertainty in general, i.e. in latch mode of operation, there is a possibility of overriding the stored state in the circuit.

Conventional switching mixers introduce relatively large harmonics at multiples of Radio Frequency (RF) signal input and/or RF signal output frequency of transceivers, demanding filtering in specific locations of the signal chain in the transceivers. Indeed the aforementioned 4 phase signals in an I/Q modulator has a harmonic suppression/conversion effect. The fact that the I/Q mixer samples with the quadrature LO signals results in image rejection for each harmonic, however the remaining odd harmonics on the antenna port will reradiate and/or down converted to baseband. This is because even in receivers, passive mixers which are bidirectional type of mixers, will back up-convert baseband signals present on capacitors in baseband circuits during each LO cycle. In other words out of band interferers at odd harmonics of the LO signals will be down converted to baseband. Odd harmonics reradiate as well from antenna in receivers after back up-conversion and radiate in transmitters after conversion. Hence suppression of the out of band interferers and suppression of direct radiation of odd harmonics by filtering or HRM will be essential for performance. However, substantial cost saving could be achieved by removal or reducing the filter's performance. In wideband systems the issue is more important to tackle. This is because e.g. in a wideband low noise amplifier (LNA) in the receiver, interferers will be amplified with lower selectivity in the signal chain. It is thus important to suppress the 3rd and higher order harmonic.

The HRM based transceivers mainly address bandwidth, selectivity and filtering metrics in emerging wireless communication. Nowadays, almost all HRM-based transceivers use I/Q type of modulators for purpose of image rejection and bandwidth efficiency.

Among the different orders of the harmonics, the 3rd order harmonic is the most critical one to remove. The rejection of the 3rd order harmonic may be done by a six-phase harmonic rejection mixer. However, the 6-phase harmonic rejection mixer needs a clock driver which can deliver six pulse signals with 60 degrees consecutive phase difference in-between, hereafter referred as 6-phase signals. The 6-phase signals should have either a non-overlapped duty cycle of 16.7% or an overlapped duty cycle of 33.3% to drive the mixer. However, generation of the 6-phase signals with 16.7% duty cycle directly is of prime importance for high performance, e.g. lower noise in receivers, to avoid accomplishing the action of commutating from 33.3% duty cycle pulses to 16.7% duty cycle pulses in mixer switches.

Harmonic rejection mixers up to $5^{th}$ order may be realized as 8-phase mixers for suppression of $3^{rd}$ and $5^{th}$ harmonics. However a 6-phase mixer in receiver which mainly suppresses $3^{rd}$ harmonic is considered as a more practical approach to an 8-phase and higher order multi-phase mixers.

The generation of 6-phase signals may be implemented as a division locking structure as described in Raul Magoon et. al., *RF local oscillator path for GSM Direct conversion transceiver with true 50% divided by three and active third harmonic cancellation*, IEEE Radio Frequency Integrated Circuits Symposium, 2002, and in A. Nejdel, et. al., *A 0.7-3.7 GHz Six Phase Receiver Front-End With Third Order Harmonic Rejection*, European Solid State Circuits Conference (ESSCIRC) 2013.

In these prior art design approaches, and in the former case the on-chip local oscillator (LO) multi-phase signal generation circuitry is clocked by a differential external signal at three times the desired LO frequency. The function of division and phase generation is accomplished by three double-edge triggered D flip-flops, implemented in current mode logic (CML) in bipolar technology. The output signals of the divider are 50% duty cycle LO signals, phase shifted by 60 degree with respect to one another. Further, in the latter design approach, the output signals are generated by laches implemented in CML-to-CMOS logic level converter, and then CMOS logic is used to generate either 16.7% or 33.3% duty cycle signals. The major drawback of the mentioned prior art approaches is high power consumption of CML type of circuit and limited high frequency operation. The low jitter noise in these design approaches as an important metric, is improved by relatively high current capability of involved active devices with relatively large idle DC current. The involved active devices fulfill jitter noise requirement, but tend to be large with more parasitic and hence have limited highest operating frequency. An additional consequence is large total current consumption which results in larger DC—as well as larger dynamic—power dissipation. The generation of 6-phase signals may also be implemented by injection locking as described in C. Zhou, et. al., *A 50% wide locking range divide by* 3 *up to* 6 *GHz*, IEEE Radio Frequency Integrated Circuits Symposium (RFIC), 2011. The injection locked approach uses frequency dependent tuning components, which is inherently band limited. Indeed with this type of circuit structure, it is hard to pass an operating frequency limit higher than 7 GHz even though relatively fast 65 nm device technology was used in benchmarking of the circuit performance.

In addition to the applications mentioned above, where 4-phase signals and 6-phase signals are needed for the I/Q mixers and HRM in 6-phase mixers in the transceivers, higher order multi-phase signals, e.g. 8, 10, 12, . . . 32, . . . may be needed in future transceivers or for other applications in other electronic devices, e.g. oscillator scopes, measurement instruments etc.

SUMMARY

Therefore, a novel improved solution which is generic and capable of generating multi-phase signals is well needed.

A first object of embodiments herein is to provide an electronic latch circuit with simplified circuit topology and improved performance.

According to a first aspect of embodiments herein, this object is achieved by an electronic latch circuit which comprises an output circuit comprising a first output, a second output and a third output and an input circuit comprising a first input, a second input and a clock signal input.

The input circuit further comprises a first Metal Oxide Semiconductor transistor, MOST with a gate connected to the first input, a source connected to a first voltage potential and a drain connected to a first node of the output circuit.

The input circuit further comprises a second MOS transistor with a gate connected to the second input, a source connected to the first voltage potential and a drain connected to a second node of the output circuit.

The input circuit further comprises a third MOS transistor with a gate connected to the clock signal input, a source connected to a second voltage potential, and a drain connected to a third node of the output circuit.

The output circuit comprises a fourth MOS transistor with a drain connected to the first node, a gate connected to the second node, and a source connected to the third node.

The output circuit further comprises a fifth MOS transistor with a drain connected to the second node, a gate connected to the first node, and a source connected to the third node.

Further, the first output is connected to the first node, the second output is connected to the second node and the third output is connected to the third node.

The electronic latch circuit is configured to change state based on input signals at the inputs of the input circuit and a present state of the output circuit.

A second object of embodiments herein is to provide a multi-phase signal generator with improved performance.

According to one aspect of embodiments herein, this object is achieved by a multi-phase signal generator for generating N phase signals with individual phases. The multi-phase signal generator comprises a first clock signal input, a second clock signal input and N outputs.

The multi-phase signal generator further comprises a plurality N of the electronic latch circuit according to embodiments herein described above.

The plurality N of the electronic latch circuit are cascaded with each other in the following way:

The first and second outputs of the i-th electronic latch circuit are coupled to the first and second inputs of the (i+1)-th electronic latch circuit, wherein i=1, 2, . . . N−1; and The first and second outputs of the N-th electronic latch circuit are cross coupled to the first and second inputs of the first electronic latch circuit to form a negative feedback.

Further, the first clock input is connected to the clock signal inputs of the k-th electronic latch circuits, wherein k is an odd number, and k=1, 3, . . . N−1; and the second clock input is connected to the clock signal inputs of the j-th electronic latch circuits, wherein j is an even number, and j=2, 4, . . . N.

Finally, the N phase signals are generated via the outputs of each electronic latch circuit.

The electronic latch circuit according to embodiments herein has some advantages compare to the prior art. For example, the electronic latch circuit comprises only 5 MOS transistors, i.e. it has a minimum number of devices and therefore is compact and power efficient. Further it uses smaller active device periphery and is faster and suitable for higher frequencies applications because of lower parasitic associated to the circuit implementation. Moreover since the electronic latch circuit is configured to change state based on all three input signals to the input circuit and the present state of the output circuit, the state is more stable or robust, and there is less possibility of overriding the stored state in the circuit.

As a result of these advantages of the electronic latch circuit described above, the multi-phase signal generator build by the electronic latch circuit is also compact, stable, power efficient and able to operate at higher frequencies. Moreover, the structure and connection of the multi-phase signal generator is generic and capable of performing both division and generation of phases. Further, the jitter noise of the circuit is more related to voltage over the active devices than their idle current as a result that the multi-phase signal generator operates in current starved mode in which the current in the active devices are controlled by the clock signal input.

Thus, embodiments herein provide an electronic latch circuit with improved performance. Thanks to the improved performance of the electronic latch circuit, a multi-phase signal generator using the electronic latch circuit to generate multi-phase signals also has improved performance.

BRIEF DESCRIPTION OF THE DRAWINGS

Examples of embodiments herein are described in more detail with reference to attached drawings in which.

DETAILED DESCRIPTION

In this disclosure the definition of logical levels should be interpreted as follows:
 A low state should be interpreted as a voltage level indicating a value of 0 or logical low.
 A high state should be interpreted as a voltage level indicating a value of 1 or logical high.

In the following, different aspects will be described in more detail with references to certain embodiments and to accompanying drawings. For purposes of explanation and not limitation, specific details are set forth, such as particular scenarios and techniques, in order to provide a thorough understanding of the different embodiments. However, other embodiments that depart from these specific details may also exist.

Figure 1:
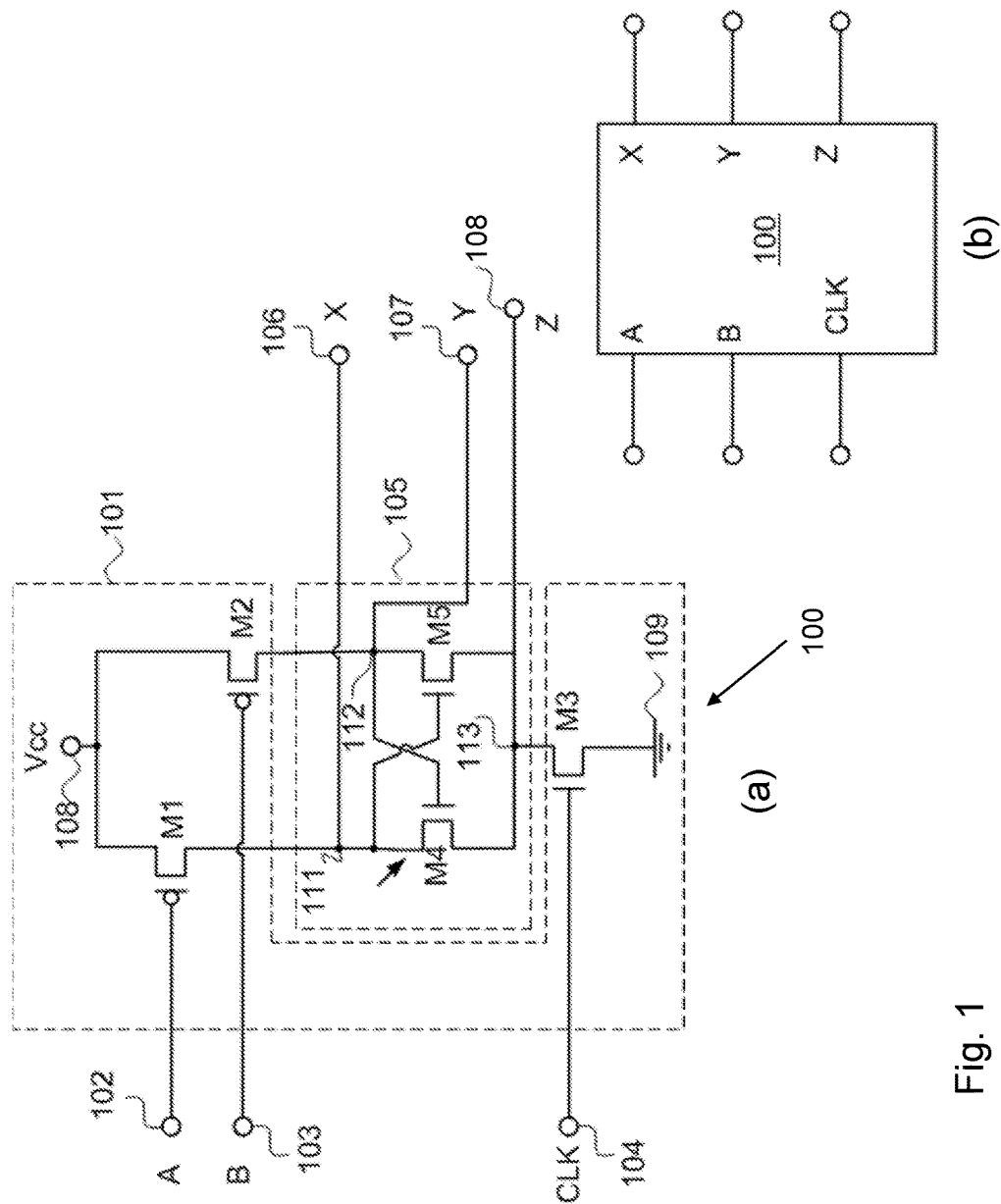
FIG. 1 (*a*) is a circuit schematic illustrating an electronic latch circuit according to embodiments herein and (*b*) is a symbol of the electronic latch circuit.

FIG. 1 (a) is a circuit diagram of an electronic latch circuit, generally designated 100, according to one embodiment. The electronic latch circuit 100 comprises an input circuit 101 and an output circuit 105.

The input circuit 101 comprises an input A, 102 and an input B, 103 for receiving signals comprising low states or high states from connectable external circuits. The input circuit 101 further comprises a clock signal input CLK, 104 configured to receive a clock signal from an external clock circuit. The clock signal provides alternating states between the low state and the high state at a predetermined frequency and duration.

The input circuit 101 further comprises a first Metal Oxide Semiconductor (MOS) transistor M1 with a gate connected to the input A, 102 and a second MOS transistor M2 with a gate connected to the input B, 103. A source of the first MOS transistor M1 and source of the second MOS transistor M2 are connected to a first voltage potential, e.g. a supply voltage VCC, 108. Finally, a drain of the first MOS transistor M1 is connected to a first node 111 of the output circuit 105, and a drain of the second MOS transistor M2 is connected a second node 112 of the output circuit 105.

In this embodiment, the first and the second MOS transistors M1, M2 may be P-MOS transistors.

The input circuit 101 further comprise a third MOS transistor M3 with a gate connected to the clock signal input CLK, 104 a source connected to a second voltage potential 109, and a drain connected to a third node 113 of the output circuit 105.

The second voltage potential 109 may in one embodiment be a ground potential. The second voltage potential 109 may in another embodiment be a potential lower than the first voltage potential 108, e.g. the supply voltage VCC.

The output circuit 105 comprises a first output X, 106, a second output Y, 107 and a third output Z, 108. The output circuit 105 may further comprise a fourth MOS transistor M4 with a drain connected to the first node 111, a gate connected to the second node 112 and a source connected to the third node 113. The output circuit 105 further comprises a fifth MOS transistor M5 with a drain connected to the second node 112, a gate connected to the first node 111 and a source connected to the third node 113. In this way, M4-M5 in the output circuit 105 act as a regenerative device pair. The third MOS transistor M3, the fourth MOS transistor M4 and the fifth MOS transistor M5 may be N-MOS transistors.

Further, the first output X, 106 is connected to the first node 111, the second output Y, 107 is connected to the second node 112 and the third output Z, 108 is connected to the third node 113.

The electronic latch circuit 100 is configured to change state based on input signals at the inputs A, B, CLK of the input circuit 101 and a present state of the output circuit 105.

The function and states of the electronic latch circuit 100 will now be discussed with reference made to FIG. 2 in order to fully disclose the operation of the electronic latch circuit 100 according to FIG. 1.

In order to provide a concise description, it is convenient to introduce a shorthand notation for the signals of the electronic latch circuit 100 as follows:

A=0 means that input A, 102 is at a low state, indicating a logical 0.

A=1 means that input A, 102 is at a high state, indicating a logical 1.

Hence, CLK=0 should be interpreted as a low state on the clock signal input 104, indicating a logical 0.

X=1 should be interpreted as a high state on the output X, etc.

A transition from A=0 to A=1 is indicated by A=0|1.

The Boolean operator AND is written as '&'. Thus, A=0 & B=1 indicates a low state on input A and a high state on input B.

Figure 2:
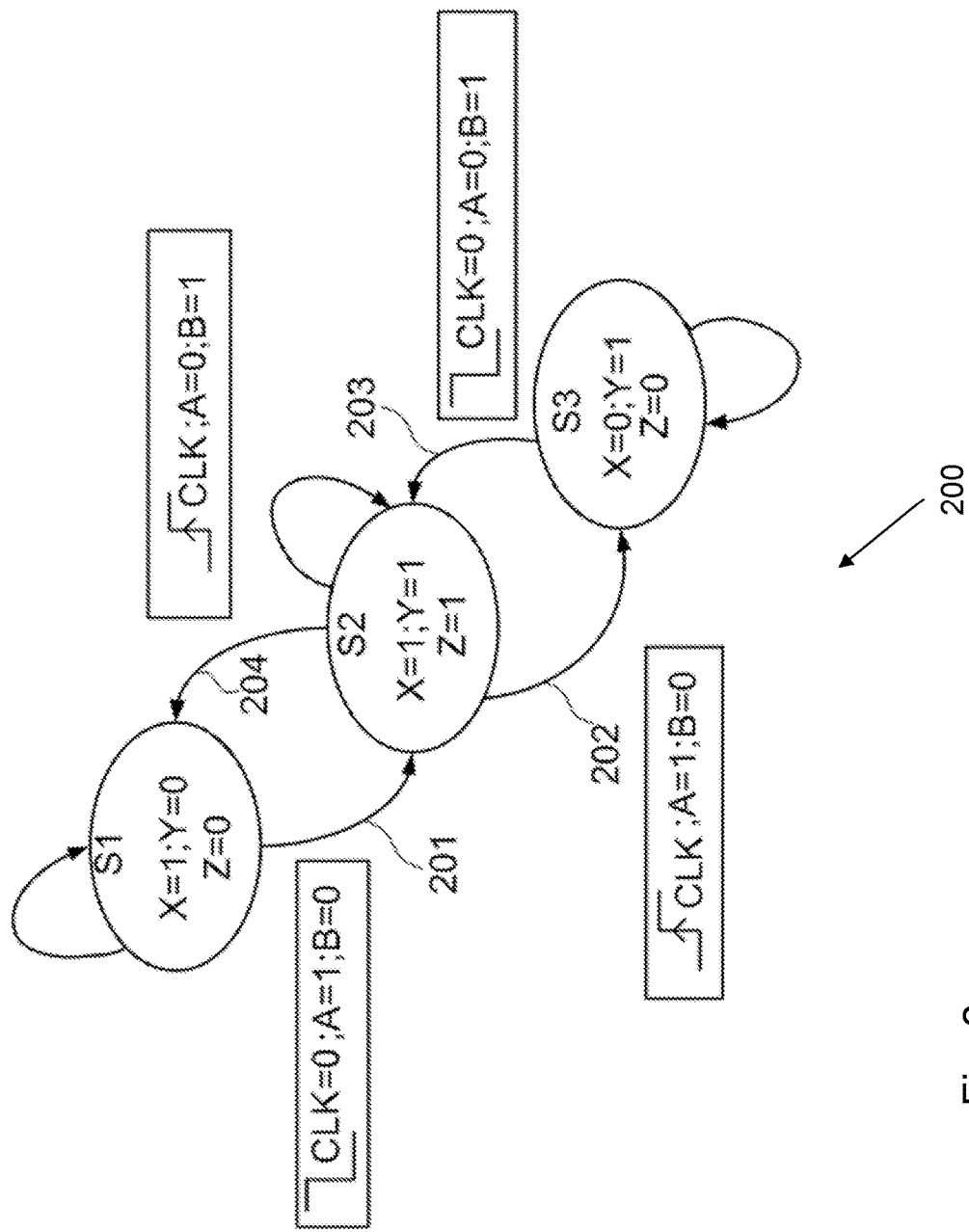
FIG. 2 is a state diagram illustrating different states of the electronic latch circuit according to embodiments herein.

It is possible to define a state machine from the inner workings of the electronic latch circuit 100. A state machine is generally described with a state diagram as shown in FIG. 2, designated 200. This state diagram 200 defines three different states for the output circuit 105, of the electronic latch circuit 100, from the group of:

A first state S1, comprising a high state at the output X, a low state at the output Y, and a low state at the output Z, i.e. X=1, Y=0, Z=0;

A second state S2, comprising a high state at the output X and at the output Y, and a high state at the output Z, i.e. X=1, Y=1, Z=1;

A third state S3, comprising a low state at the output X, a high state at the output Y, and a low state at the output Z, i.e. X=0, Y=1, Z=0;

Each of these states is illustrated as ellipses in FIG. 2.

The transition from a state to another state is controlled by the input signals to the input circuit 101, i.e. the input signals at A, B and CLK as well as by the present state of the output circuit 105.

In the following, different situations and conditions for changing state in the electronic latch circuit 100 will be described as different actions:

Action 201: S1→S2, i.e. (X=1, Y=0, Z=0)→(X=1, Y=1, Z=1)

The electronic latch circuit 100 changes from the first state S1 to the second state S2 upon detecting a high state on the input A 102, a low state on the input B 103, a low state on the clock signal input 104, and that the output circuit 105 is in the first state S1. Which is denoted A=1 & CLK=0 & B=0 & State=S1 using the above short-hand notation.

A=1 and B=0, which causes the first MOS transistor M1 to be off, and the second MOS transistor M2 to be on, the present state X=1 causes M5 to be on, and CLK=0 which causes the third MOS transistor M3 to be off. This condition pull up the voltage potential at nodes 112 and 113 to the supply voltage VCC, i.e. the logic high, so Y=1, Z=1, while X keeps to 1.

Action 202: S2→S3, i.e. (X=1, Y=1, Z=1)→(X=0, Y=1, Z=0)

The electronic latch circuit 100 changes from the second state S2 to the third state S3 upon detecting a transition on the clock signal input CLK from a low state to a high state CLK=0|1 and A=1 & B=0 and the output circuit 105 is in the second state S2, which is denoted A=1 & CLK=0|1 & B=0 & State=S2.

At the rising edge of the clock signal CLK=0|1, the third transistor M3 turns on. The output Z is pulled down to the second voltage potential, i.e. logic low, so Z=0. The circumstances of the signals A=1 and B=0, gives M1 off and M2 on, and the present state Y=1 causes M4 to be on, so the voltage potential at node 111 is also pulled down to logic low, which gives X=0, accordingly M5 is off, so X=0, Z=0, while Y keeps to 1.

Action 203: S3→S2, (X=0, Y=1, Z=0)→(X=1, Y=1, Z=1)

The electronic latch circuit 100 changes from the third state S3 to the second state S2 upon detecting a high state on the input B 103, a low state on the input A 102, and low state on the clock signal input CLK 104 and that the output circuit 105 is in the third state S3. Which is denoted A=0 & CLK=0 & B=1 & State=S3.

The input A=0 which causes the first MOS transistor M1 turns on, which in turn causes a high state on the first node 111 and on the output X, CLK=0 which turns off the third MOS transistor M3, and the present state Y=1 causes M4 to be on, so Z is pulled up to high state, Z=1. While B=1, M2 off, Y keeps to 1.

Action 204: S2→S1, i.e. (X=1, Y=1, Z=1)→(X=1, Y=0, Z=0)

The electronic latch circuit 100 changes from the second state S2 to the first state S1 upon detecting a transition on the clock signal input CLK 104 from a low state to a high state, a high state on the input B 103, a low state on the input A 102, and the output circuit 105 is in the second state S2. This condition can be expressed as CLK=0|1 & B=1 & A=0 & State=S2 using the above defined short-hand notation.

At the rising edge of the clock CLK=0|1, M3 will turn on. The output Z is pulled down to the second voltage potential, i.e. logic low, so Z=0. The circumstances of the signals A=0 and B=1, gives M1 on and M2 off, and the present state X=1 causes M5 to be on, so the voltage potential at node 112 is also pulled down to logic low, which gives Y=0, accordingly M4 is off. So Y=0, Z=0, while X keeps to 1.

From above description, it can be seen that pulse signals may be generated at the outputs X, Y, Z with control signals at the inputs A, B, CLK. For example, in Action 201, the state changes from S1 to S2, so Z changes from 0 to 1. In Action 202, the state changes from S2 to S3, so Z changes from 1 to 0. As a result of these two actions, a pulse signal with a unique or an individual phase is generated at output Z. The pulse signal at Z is generated twice per period of signal A or B, i.e. $T_Z=T_A/2$, $T_Z=T_B/2$, where $T_Z$ is time period of signal Z and $T_A$, $T_B$ are period of signal A and B respectively.

The purpose of above description on actions and the example on pulse signal generation at output Z is to make an easy understanding of the electronic latch circuit 100. The principle behind the output signals at Z is more complicated than mentioned actions 201-204. The output at Z value moreover is determined by the current flow in the involved active devices depending on input signal transitions as well as the latching action of the regenerative device pair M4-M5.

With these state changes or actions in mind, multi-phase signal generators may be implemented by connecting a plurality of the electronic latch circuit 100 according to embodiments herein.

Figure 3:
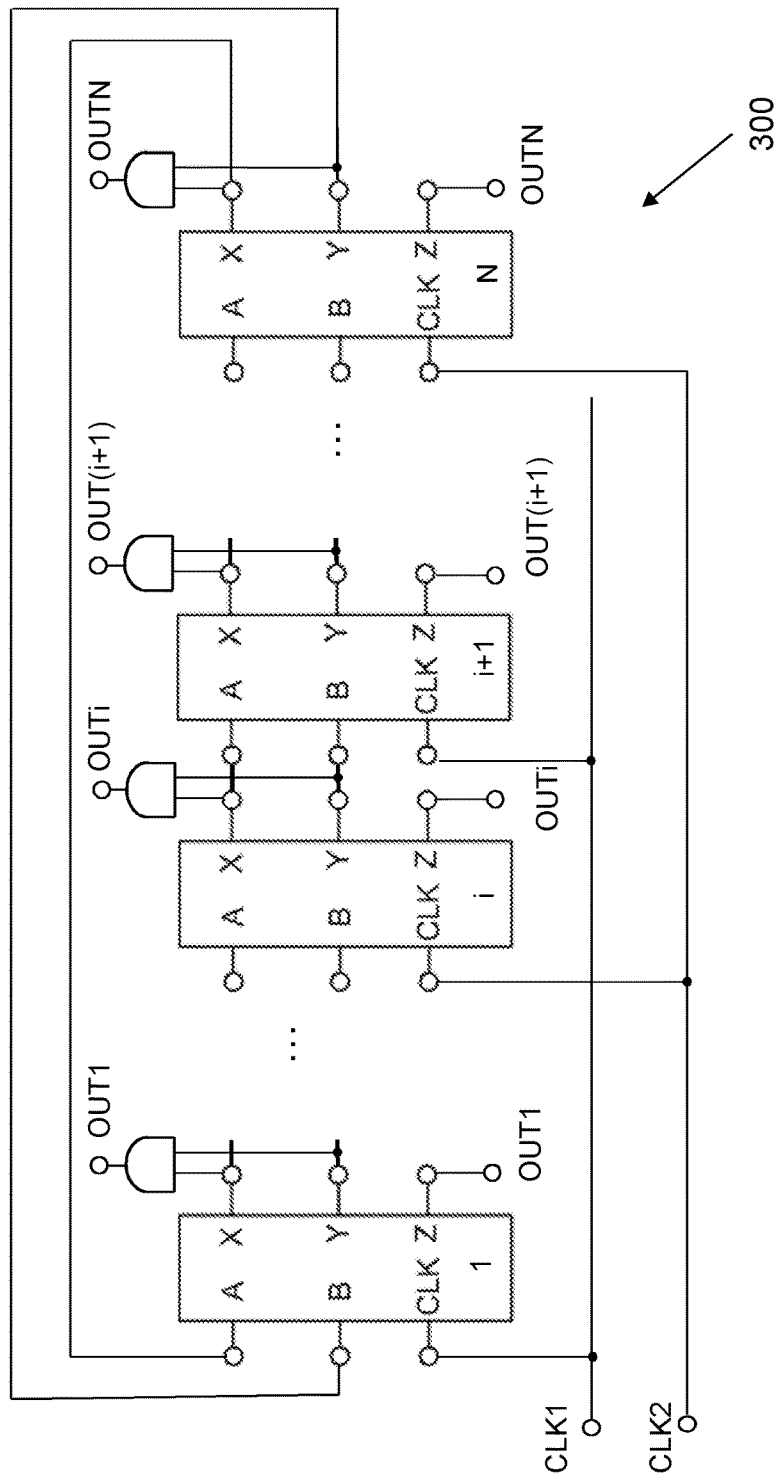
FIG. 3 is a block diagram illustrating a multi-phase signal generator according to embodiments herein.

According to some embodiments herein, a multi-phase signal generator 300 is used for generating N phase signals with individual phases, as shown in FIG. 3. The multi-phase signal generator 300 comprises a first clock signal input CLK1, a second clock signal input CLK2 and N outputs Out1, Out2, . . . OutN.

The multi-phase signal generator further comprises a plurality N of the electronic latch circuit 100 as described above.

The plurality N of the electronic latch circuit 100 are cascaded with each other to form a ring similar to a ring oscillator. The detailed connection is implemented as follows:

the first and second outputs X, Y of the i-th electronic latch circuit 100 are coupled to the first and second inputs A, B of the (i+1)-th electronic latch circuit 100, wherein i=1, 2, . . . N−1; and the first and second outputs X, Y of the N-th electronic latch circuit 100, i.e. the last one, are cross coupled to the first and second inputs A, B of the first electronic latch circuit 100 to form a negative feedback; and the first clock input CLK1 is connected to the clock signal inputs CLK of the k-th electronic latch circuits 100, wherein k is an odd number, and k=1, 3, . . . N−1; and the second clock input CLK2 is connected to the clock signal inputs CLK of the j-th electronic latch circuits 100, wherein j is an even number, and j=2, 4, . . . N; and the N phase signals are generated via the outputs X, Y, Z of each electronic latch circuit 100.

As described above, the plurality N of the electronic latch circuit 100 are cascaded with each other, their principle and functions are as in ring oscillators and need to be connected in a negative feedback fashion. According to some embodiments herein, the internal coupling between the inputs and outputs from one electronic latch circuit 100 to the next electronic latch circuit 100 may be cross coupled. For example, the first output X of a first electronic latch circuit 100 may be coupled to the second input B of the next electronic latch circuit 100, and the second output Y of the first electronic latch circuit 100 may be coupled to the first input A of the next electronic latch circuit 100.

Wire twisting and cross coupling are usual ways of implementing connections for balanced structure, for robust design and reduced coupling etc. So, they are desirable when applicable, e.g. in physical layout implementation. According to some embodiments herein, in the multi-phase signal generator 300, totally an odd number of cross couplings may be implemented when connecting the plurality N of the electronic latch circuit 100, and the negative feedback is still ensured in the multi-phase signal generator 300.

According to some embodiments herein, the multi-phase signal generator 300 is configured to receive a first clock signal at the first clock signal input CLK1; and receive a second clock signal at the second clock signal input CLK2; and wherein the second clock signal is the inverse of the first clock signal. Then, the N phase signals are generated at the third outputs Z, 108 of each electronic latch circuit 100. In this embodiment, the N outputs Out1, Out2, . . . OutN are connected to the third outputs Z, 108 of each electronic latch circuit 100.

According to some embodiments herein, the multi-phase signal generator 300 is configured to receive a first clock signal at the first clock signal input CLK1; and receive a second clock signal at the second clock signal input CLK2; and wherein the second clock signal is the inverse of the first clock signal. Further, the multi-phase signal generator is configured to comprise N AND-gating circuits, and the N phase signals are generated by AND-gating signals generated at the first and second outputs X, Y of each electronic latch circuit 100. In this embodiment, the N outputs Out1, Out2, . . . OutN are connected to the outputs of each AND-gating circuit.

In order to explain the function of the multi-phase signal generator 300, some examples, such as a 4-phase, a 6-phase, and an 8-phase signal generators, i.e. N=4, 6, 8, are given and described in the following section.

Figure 4:
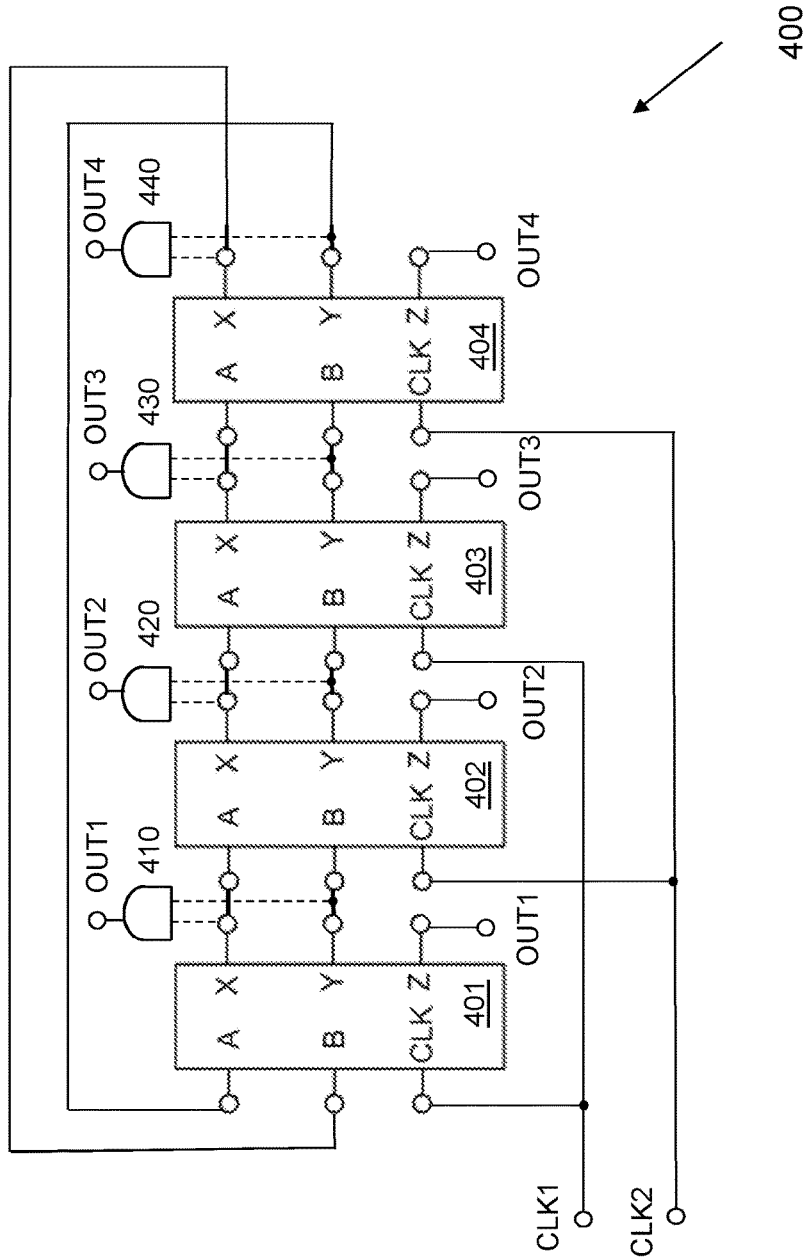
FIG. 4 is a block diagram illustrating a 4-phase signal generator according to embodiments herein.

FIG. 4 shows a 4-phase signal generator 400 which may generate 4 phase signals with ¼=25% duty cycle each and 90 degree phase shifted with respect to each other.

As shown in FIG. 4, the 4-phase signal generator 400 comprises four electronic latch circuits 100 cascaded with each other, denoted as 401, 402, 403, 404. The first and second outputs X, Y of the first electronic latch circuit 401 are coupled to the first and second inputs A, B of the second electronic latch circuit 402. The first and second outputs X, Y of the second electronic latch circuit 402 are coupled to the first and second inputs A, B of the third electronic latch circuit 403. The first and second outputs X, Y of the third electronic latch circuit 403 are coupled to the first and second inputs A, B of the fourth electronic latch circuit 404. And the first and second outputs X, Y of the fourth electronic latch circuit 404, i.e. the last one, are cross coupled to the first and second inputs A, B of the first electronic latch circuit 401 to form a negative feedback.

Further, the first clock input CLK1 is connected to the clock signal inputs CLK of the first and third electronic latch circuits 401, 403; and the second clock input CLK2 is connected to the clock signal inputs CLK of the second and fourth electronic latch circuits 402, 404.

The 4 phase signals are generated either at the outputs Z of each electronic latch circuits 401, 402, 403, 404 or at the outputs of AND-gating circuits 410, 420, 430, 440 by gating the signals generated at the outputs X, Y of each electronic latch circuits 401, 402, 403, 404.

Figure 5:
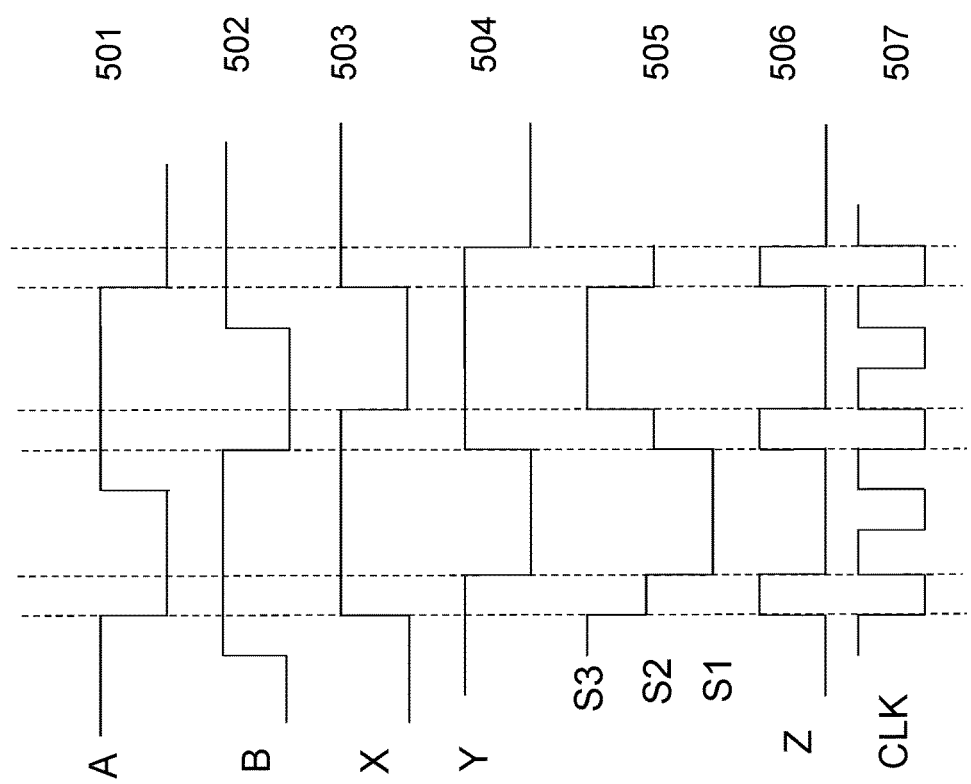
FIG. 5 is a graph illustrating the different signals' time-event of the 4-phase generator shown in FIG. 4.

FIG. 5 illustrates the different input and output signals, and states of one of the electronic latch circuit in the 4-phase generator according to embodiments herein.

In FIG. 5, plot 501 shows the input signal at input A; plot 502 shows the input signal at input B; plot 503 shows the output signal at output X; plot 504 shows the output signal at output Y; plot 505 shows the states of the electronic latch circuit; plot 506 shows the output signal at output Z; and plot 507 shows the input signal at input CLK.

The frequencies of signals at the inputs A, B, CLK are $f_A$, $f_B$, $f_{CLK}$, and at the outputs X, Y, Z are $f_X$, $f_Y$, $f_Z$.

The periods of signals at the inputs A, B, CLK are $T_A$, $T_B$, $T_{CLK}$, and at the outputs X, Y, Z are $T_X$, $T_Y$, $T_Z$.

As shown in FIG. 5, the pulse signals shown by plot 506 are generated twice per period of signal A or B. So $T_Z=T_A/2$, $T_Z=T_B/2$.

Signals at A, B, X, Y have same frequency and hence have same time period $T_A=T_B=T_X=T_Y$.

The 4-phase signal generator 400 is driven by two CLK signals with 180 degree phase deference, i.e. is in inverse with each other.

The period of the signals at the inputs A and B is N times of the period of the signal at CLK, i.e. $T_A=T_B=T_X=T_Y=N*T_{CLK}$, then $T_Z=T_A/2=N*T_{CLK}/2$.

For the 4-phase signals generator, N=4, so $T_Z=T_A/2=4*T_{CLK}/2=2*T_{CLK}$, i.e. $f_Z=f_{CLK}/2$.

The 4-phase signal generator is thus operating as a frequency divide-by-2 circuit which generates 4 output signals at each output Z of the electronic latch circuits 401, 402, 403, 404.

The 4 phase output signals may also be obtained at the outputs of the AND-gating circuits 410, 420, 430, 440 which receive signals from outputs X, Y of each electronic latch circuits 401, 402, 403, 404.

Figure 6:
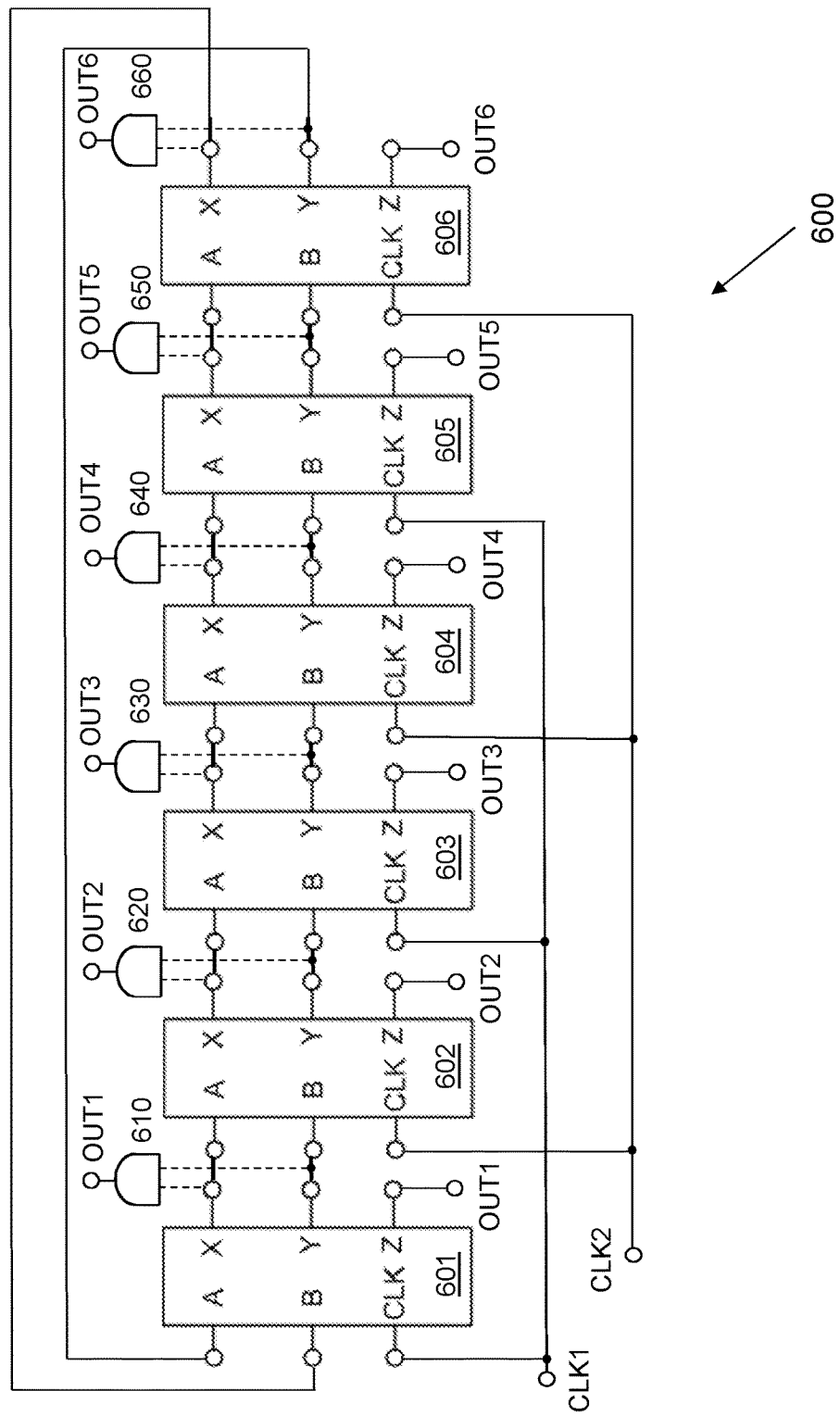
FIG. 6 is a block diagram illustrating a 6-phase signal generator according to embodiments herein.

FIG. 6 shows a 6-phase signal generator 600 which may generate 6 phase signals with ⅙=16.6% duty cycle, 60 degree phase shifted with respect to each other.

As shown in FIG. 6, the 6-phase signal generator 600 comprises six electronic latch circuits 100 cascaded with each other, denoted as 601, 602, 603, 604, 605, 606. The first and second outputs X, Y of the first electronic latch circuit 601 are coupled to the first and second inputs A, B of the second electronic latch circuit 602. The first and second outputs X, Y of the second electronic latch circuit 602 are coupled to the first and second inputs A, B of the third electronic latch circuit 603 and so on. Finally the first and second outputs X, Y of the sixth electronic latch circuit 606, i.e. the last one, are cross coupled to the first and second inputs A, B of the first electronic latch circuit 601 to form a negative feedback.

Further, the first clock input CLK1 is connected to the clock signal inputs CLK of the first, third and fifth electronic latch circuits 601, 603, 605; and the second clock input CLK2 is connected to the clock signal inputs CLK of the second, fourth and sixth electronic latch circuits 602, 604, 606.

The 6 phase signals are generated either at the outputs Z of each electronic latch circuits 601, 602, 603, 604, 605, 606 or at the outputs of AND-gating circuits 610, 620, 630, 640, 650, 660 by gating the signals generated at the outputs X, Y of each electronic latch circuits 601, 602, 603, 604, 605, 606.

Figure 7:
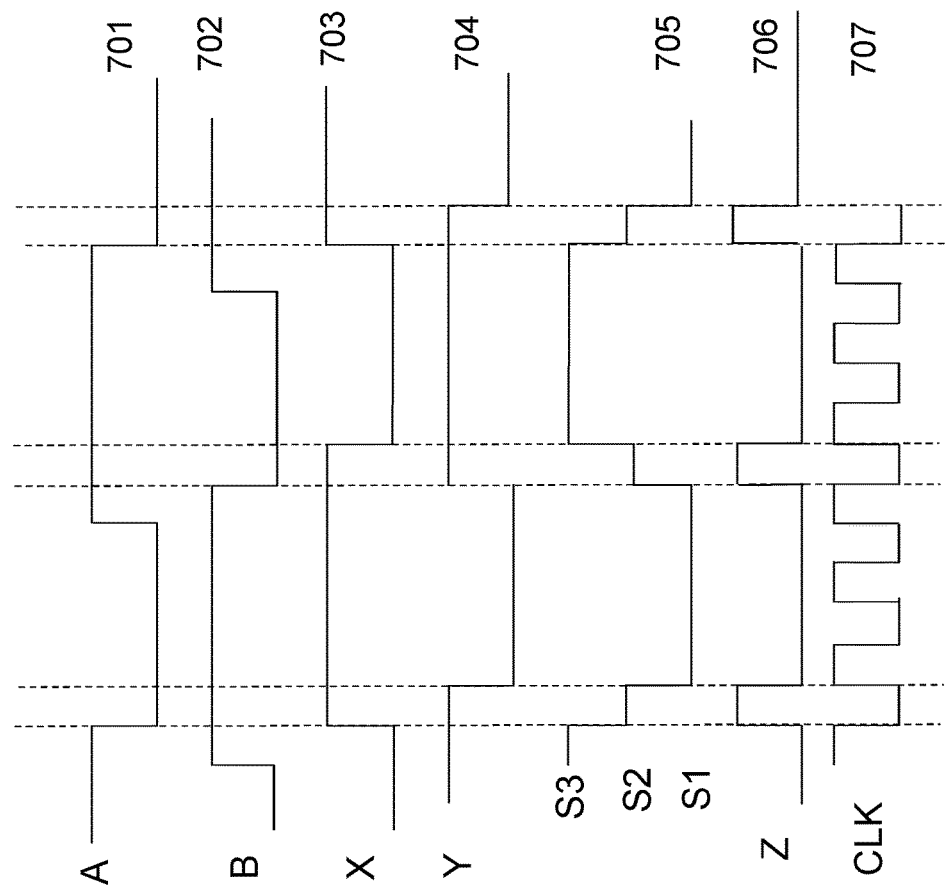
FIG. 7 is a graph illustrating the different signals' time-event of the 6-phase generator shown in FIG. 6.

FIG. 7 illustrates the different input and output signals, and states of one of the electronic latch circuit in the 6-phase generator according to embodiments herein.

As in the 4-phase signals generator, signals at A, B, X, Y have same frequency and hence have same time period $T_A=T_B=T_X=T_Y$.

The 6-phase signal generator 600 is driven by two CLK signals with 180 degree phase deference, i.e. is in inverse with each other.

$T_A=T_B=T_X=T_Y=6*T_{CLK}$, then $T_Z=T_A/2=6*T_{CLK}/2=3*T_{CLK}$, i.e.

$f_Z=f_{CLK}/3$.

The 6-phase signal generator is thus operating as a divide-by-3 circuit which generates 6 output signals at each output Z of the electronic latch circuits 601, 602, 603, 604, 605, 606.

The 6 phase output signals may also be obtained at the outputs of the AND-gating circuits 610, 620, 630, 640, 650, 660 which receive signals from outputs X, Y of each electronic latch circuits 601, 602, 603, 604, 605, 606.

The principle and structure of the multi-phase signal generator according to embodiments herein may be used to generate other higher order phase signals, such as N=8, 10, 12, 14, . . . with duty cycle ⅛=12.5%, ¹/₁₀=10%, ¹/₁₂=8.33%, ¹/₁₄=7.14% etc.

Figure 8:
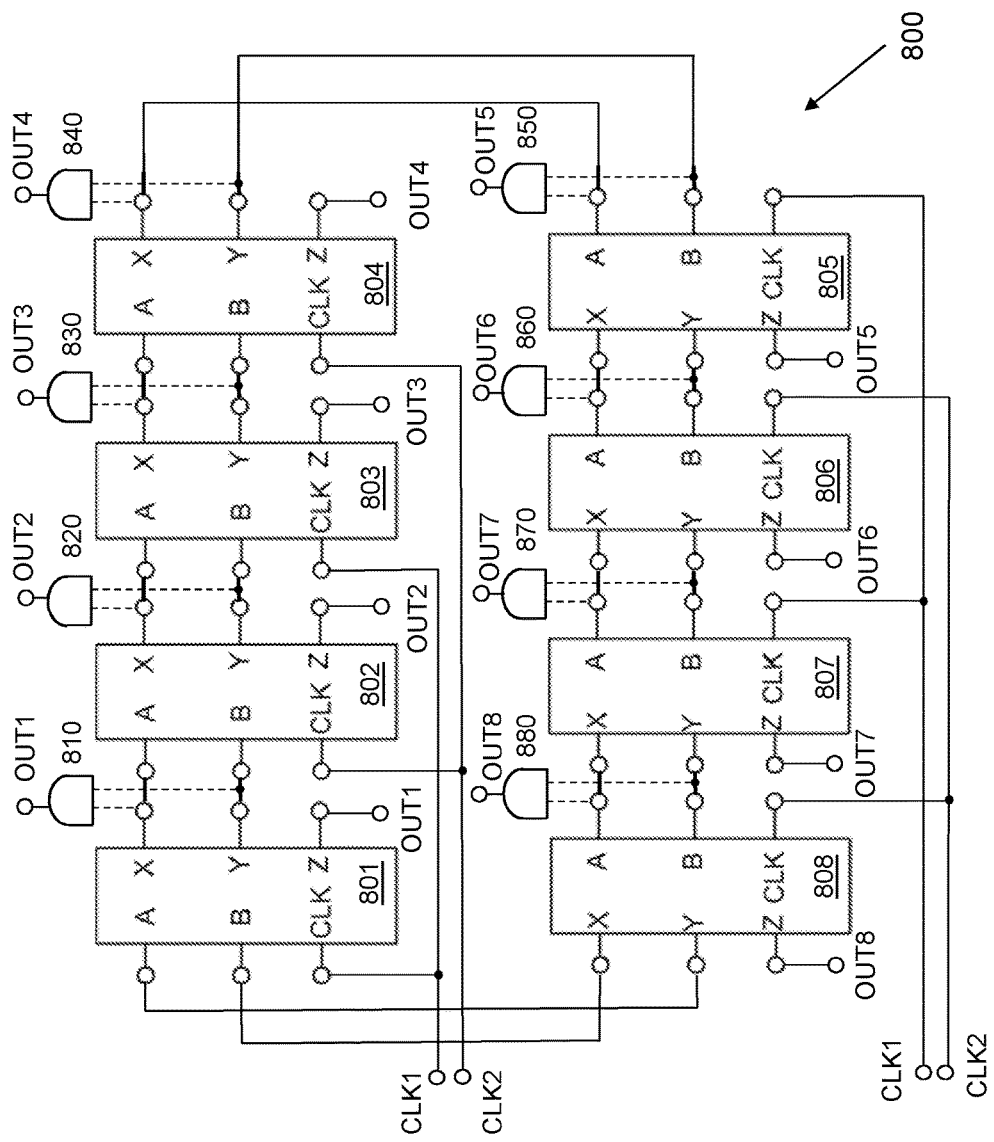
FIG. 8 is a block diagram illustrating an 8-phase signal generator according to embodiments herein.
Figure 9:
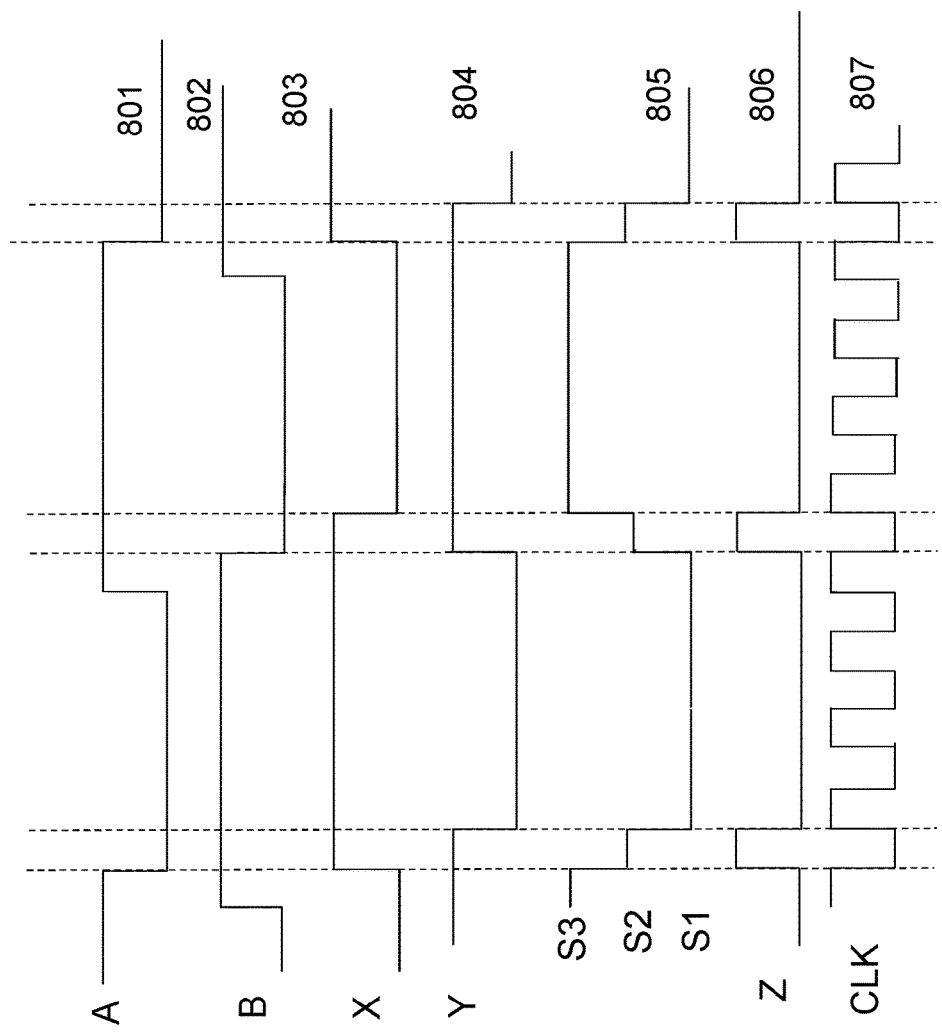
FIG. 9 is a graph illustrating the different signals' time-event of the 8-phase generator shown in FIG. 8.

FIG. 8 shows one more example of an 8-phase signal generator which may generates 8 phase signals. FIG. 9 illustrates the different input and output signals, and states of one of the electronic latch circuit in the 8-phase generator. The connection, function and signal generation of the 8-phase signal generator are similar to the 4-phase and 6-phase signal generators, therefore their description is omitted here.

To summarise the discussions above, advantages of various embodiments of the electronic latch circuit 100 and the multi-phase generator 300, 400, 600, 800 according to embodiments herein include:

The electronic latch circuit 100 is compact, power efficient and relatively faster due to the smaller active device periphery and the lower parasitic capacitance compared to the prior art. Moreover, the state changing is based on all three input signals and the present state and thus is state-stable in term of possibility of overriding an existing state.

The function of the electronic latch circuit 100 is less dependent on current than the CML circuits and the operation is mainly based on voltage switching of the active devices, hence enlarging the size of the transistors to boost the current and improve the performance is not as important as in the CML circuits. Therefore jitter noise of the electronic latch circuit 100 is also lower than the CML circuits for the same power consumption.

The multi-phase signal generator 300, 400, 600, 800 build by the electronic latch circuit 100 is also compact, state-stable, power efficient and able to operate at higher frequencies.

The structure and connection of the multi-phase signal generator 300 is generic and is capable of performing both division and generation of phases.

Figure 10:
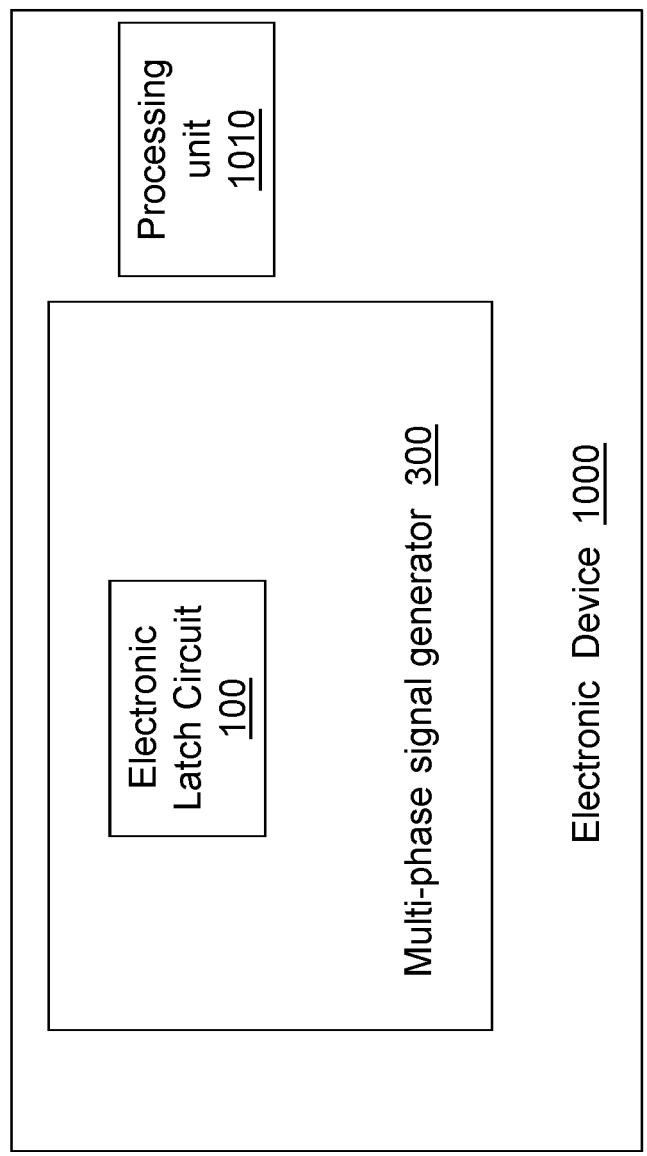
FIG. 10 is a block diagram illustrating an electronic device in which embodiments herein may be implemented.

The electronic latch circuit 100 and the multi-phase generator 300, 400, 600, 800 according to embodiments herein may be employed in various electronic devices. FIG. 10 shows a block diagram for an electronic device 1000, which may be, e.g. a radio frequency transceiver, a wireless communication device, such as a user equipment or a mobile device and/or a base station, or any general electronic circuit or equipment, such as a measurement equipment or instrument, an oscillator scope etc. The electronic device 1000 may comprise other units, where a processing unit 1010 is shown.

Those skilled in the art will understand that although transistors in the electronic latch circuit 100 as shown in FIG. 1 are Metal Oxide Semiconductor transistors, MOST and any other types of transistors, e.g. Metal Oxide Field Effect Transistors (MESFET), Junction Field Effect Transistor (JFET), Bipolar Junction Transistors (BJT) etc., may be comprised in the electronic latch circuit 100. When using the word "comprise" or "comprising" it shall be interpreted as non-limiting, i.e. meaning "consist at least of".

Moreover it will be understood that in general in accordance with aspects of this invention, the functionality in the invention scope may still be achieved by interchanging supply-reference voltage polarity and/or interchanging P-type of active device with N-type, and/or implementation in conjunction with aforementioned technologies.

The embodiments herein are not limited to the above described preferred embodiments. Various alternatives, modifications and equivalents may be used. Therefore, the above embodiments should not be taken as limiting the scope of the invention, which is defined by the appending claims.

The invention claimed is:

1. An electronic latch circuit, comprising:
   an output circuit comprising a first output, a second output, and a third output;
   an input circuit comprising a first input, a second input, and a clock signal input;
   wherein the electronic latch circuit comprises only five transistors;
   wherein the input circuit comprises:
      a first Metal Oxide Semiconductor (MOS) transistor with a gate connected to the first input, a source connected to a first voltage potential, and a drain connected to a first node of the output circuit;
      a second MOS transistor with a gate connected to the second input, a source connected to the first voltage potential, and a drain connected to a second node of the output circuit; and
      a third MOS transistor with a gate connected to the clock signal input, a source connected to a second voltage potential, and a drain connected to a third node of the output circuit;
   wherein the output circuit comprises:
      a fourth MOS transistor with a drain connected to the first node, a gate connected to the second node, and a source connected to the third node; and
      a fifth MOS transistor with a drain connected to the second node, a gate connected to the first node, and a source connected to the third node;
   wherein the first output is connected to the first node, the second output is connected to the second node, and the third output is connected to the third node;
      wherein the electronic latch circuit is configured to change state based on input signals at the inputs of the input circuit and a present state of the output circuit.

2. A multi-phase signal generator for generating N phase signals with individual phases, wherein the multi-phase signal generator comprises:
   a first overall clock signal input, a second overall clock signal input, and N overall outputs;
   a plurality (N) of electronic latch circuits cascaded with each other; wherein each of the electronic latch circuits comprises:
      an output circuit comprising a first output, a second output, and a third output;
      an input circuit comprising a first input, a second input, and a clock signal input;
      only five transistors;
      wherein the input circuit comprises:
         a first Metal Oxide Semiconductor (MOS) transistor with a gate connected to the first input, a source connected to a first voltage potential, and a drain connected to a first node of the output circuit;
         a second MOS transistor with a gate connected to the second input, a source connected to the first voltage potential, and a drain connected to a second node of the output circuit; and
         a third MOS transistor with a gate connected to the clock signal input, a source connected to a second voltage potential, and a drain connected to a third node of the output circuit;

wherein the output circuit comprises:
a fourth MOS transistor with a drain connected to the first node, a gate connected to the second node, and a source connected to the third node; and
a fifth MOS transistor with a drain connected to the second node, a gate connected to the first node, and a source connected to the third node;
wherein the first output is connected to the first node, the second output is connected to the second node, and the third output is connected to the third node;
wherein the electronic latch circuit is configured to change state based on input signals at the inputs of the input circuit and a present state of the output circuit;
wherein the first and second outputs of the i-th electronic latch circuit are coupled to the first and second inputs of the (i+1)-th electronic latch circuit, wherein i=1, 2, . . . N−1; and
wherein the first and second outputs of the N-th electronic latch circuit are cross coupled to the first and second inputs of the first electronic latch circuit to form a negative feedback;
wherein the first overall clock input is connected to the clock signal inputs of the k-th electronic latch circuits, wherein k is an odd number, and k=1, 3, . . . N−1;
wherein the second overall clock input is connected to the clock signal inputs of the j-th electronic latch circuits, wherein j is an even number, and j=2, 4, . . . N; and
wherein the N phase signals are generated via the outputs of each electronic latch circuit.

3. The multi-phase signal generator of claim 2:
wherein the multi-phase signal generator is configured to receive a first clock signal at the first overall clock signal input, and receive a second clock signal at the second overall clock signal input;
wherein the second clock signal is the inverse of the first clock signal; and
wherein the N phase signals are generated at the third outputs of each electronic latch circuit.

4. The multi-phase signal generator of claim 2:
wherein the multi-phase signal generator is configured to receive a first clock signal at the first overall clock signal input, and receive a second clock signal at the second overall clock signal input;
wherein the second clock signal is the inverse of the first clock signal; and
wherein the multi-phase signal generator further comprises N AND-gating circuits, and wherein the N phase signals are generated by applying the signals generated at the first and second outputs of each electronic latch circuit to the corresponding one of the N AND-gating circuits.

5. The multi-phase signal generator of claim 2, wherein N is an even number.

6. An electronic device, comprising:
a multi-phase signal generator for generating N phase signals with individual phases;
wherein the multi-phase signal generator comprises:
a first clock overall signal input, a second overall clock signal input, and N outputs;
a plurality (N) of electronic latch circuits cascaded with each other; wherein each of the electronic latch circuits comprises:
an output circuit comprising a first output, a second output, and a third output;
an input circuit comprising a first input, a second input, and a clock signal input;
only five transistors;
wherein the input circuit comprises:
a first Metal Oxide Semiconductor (MOS) transistor with a gate connected to the first input, a source connected to a first voltage potential, and a drain connected to a first node of the output circuit;
a second MOS transistor with a gate connected to the second input, a source connected to the first voltage potential, and a drain connected to a second node of the output circuit; and
a third MOS transistor with a gate connected to the clock signal input, a source connected to a second voltage potential, and a drain connected to a third node of the output circuit;
wherein the output circuit comprises:
a fourth MOS transistor with a drain connected to the first node, a gate connected to the second node, and a source connected to the third node; and
a fifth MOS transistor with a drain connected to the second node, a gate connected to the first node, and a source connected to the third node;
wherein the first output is connected to the first node, the second output is connected to the second node, and the third output is connected to the third node;
wherein the electronic latch circuit is configured to change state based on input signals at the inputs of the input circuit and a present state of the output circuit;
wherein the first and second outputs of the i-th electronic latch circuit are coupled to the first and second inputs of the (i+1)-th electronic latch circuit, wherein i=1, 2, . . . N−1; and
wherein the first and second outputs of the N-th electronic latch circuit are cross coupled to the first and second inputs of the first electronic latch circuit to form a negative feedback;
wherein the first overall clock input is connected to the clock signal inputs of the k-th electronic latch circuits, wherein k is an odd number, and k=1, 3, . . . N−1;
wherein the second overall clock input is connected to the clock signal inputs of the j-th electronic latch circuits, wherein j is an even number, and j=2, 4, . . . N; and
wherein the N phase signals are generated via the outputs of each electronic latch circuit.

7. The electronic device of claim 6, wherein the electronic device is a transceiver.

* * * * *